United States Patent
Lu

(10) Patent No.: US 8,381,147 B2
(45) Date of Patent: Feb. 19, 2013

(54) METHOD, A SYSTEM AND A PROGRAM STORAGE DEVICE FOR MODELING THE RESISTANCE OF A MULTI-CONTACTED DIFFUSION REGION

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 13/151,313

(22) Filed: Jun. 2, 2011

(65) Prior Publication Data

US 2012/0311518 A1 Dec. 6, 2012

(51) Int. Cl.
*G06F 17/50* (2006.01)
*G06F 17/11* (2006.01)
*G06F 17/17* (2006.01)

(52) U.S. Cl. ............ 716/106; 716/111; 716/136; 703/2; 703/16

(58) Field of Classification Search .................. 716/106, 716/111, 136; 703/2, 16
See application file for complete search history.

(56) References Cited

U.S. PATENT DOCUMENTS

| | | | |
|---|---|---|---|
| 4,939,681 A | 7/1990 | Yokomizo et al. | |
| 7,480,604 B2 | 1/2009 | Bianchi | |
| 7,519,930 B2 | 4/2009 | Mori | |
| 7,646,063 B1 | 1/2010 | Boyd et al. | |
| 2010/0025761 A1* | 2/2010 | Voldman | 257/338 |
| 2012/0227020 A1* | 9/2012 | Dewey et al. | 716/103 |

FOREIGN PATENT DOCUMENTS

| | | |
|---|---|---|
| JP | 62159445 A | 7/1987 |
| JP | 2002222856 A | 8/2002 |

OTHER PUBLICATIONS

Lu et al., "Characterization, Simulation, and Modeling of FET Source/Drain Diffusion Resistance," IEEE 2008 Custom Intergrated Circuits Conference (CICC), pp. 281-284.

Anonymous, "Method and System for Model Based Extraction of Field Effect Transistor (FET) Source/Drain Diffusion Resistance," IPCOM00193498D, IP.COM, Feb. 26, 2010, 8 pages.

* cited by examiner

*Primary Examiner* — Phallaka Kik
(74) *Attorney, Agent, or Firm* — Gibb & Riley, LLC; Anthony Canale

(57) ABSTRACT

Disclosed are embodiments of a method and program storage device for modeling the resistance of a multi-contacted diffusion region of a semiconductor device, such as a metal oxide semiconductor field effect transistor (MOSFET), a metal oxide semiconductor capacitor (MOS capacitor), a bipolar transistor, etc. The embodiments provide a formula for determining the total parasitic resistance ($R_{tot}$) of the diffusion region based on a sum of contributions of wire resistance, contact resistance, diffusion resistance and electric current flow from each of multiple partitions of the diffusion region. This formula allows the position of each dividing line separating adjacent partitions (i.e., between adjacent contacts) to be arbitrary. The embodiments adjust the position of each dividing line to minimize the total parasitic resistance ($R_{tot}$). This minimized total parasitic resistance ($R_{tot}$) value can then be used to more accurately model semiconductor device performance.

25 Claims, 10 Drawing Sheets

METHOD, A SYSTEM AND A PROGRAM STORAGE DEVICE FOR MODELING THE RESISTANCE OF A MULTI-CONTACTED DIFFUSION REGION

BACKGROUND

1. Field of the Invention

The disclosed embodiments relate to modeling the resistance of a diffusion region of a semiconductor device and, more particularly, to a method, a system and a program storage device for modeling the resistance of a multi-contacted diffusion region of a semiconductor device, such as a metal oxide semiconductor field effect transistor (MOSFET), a metal oxide semiconductor capacitor (MOS capacitor) or a bipolar transistor.

2. Description of the Related Art

Diffusion region resistance is one of the largest parasitic resistances that impact the performance of semiconductor devices, such as metal oxide semiconductor field effect transistors (MOSFETs), metal oxide semiconductor capacitors (MOS capacitors), bipolar transistors, etc. Thus, during semiconductor device design, accurate modeling of diffusion region resistance is very important. However, the current techniques used to model the resistance of a multi-contacted diffusion region (i.e., a diffusion region that is contacted by multiple contacts) may result in a relatively large error. Therefore, there is a need in the art for technique that can be used to more accurately model the resistance of a multi-contacted diffusion region.

SUMMARY

Disclosed herein are embodiments of a method, a system and a program storage device for modeling the resistance of a multi-contacted diffusion region of a semiconductor device, such as a metal oxide semiconductor field effect transistor (MOSFET), a metal oxide semiconductor capacitor (MOS capacitor), a bipolar transistor, etc. The embodiments provide a formula for determining the total parasitic resistance ($R_{tot}$) of the diffusion region based on a sum of contributions of wire resistance, contact resistance, diffusion resistance and electric current flow from each of multiple partitions of the diffusion region. Within this formula, the position of each dividing line separating adjacent partitions (i.e., between adjacent contacts) are arbitrarily established and, then, iteratively adjusted in order to minimize the total parasitic resistance ($R_{tot}$). Alternatively, partial derivatives of the total parasitic resistance ($R_{tot}$) with respect to the variables in the formula can be used to determine the minimized total parasitic resistance ($R_{tot}$) value. This minimized total parasitic resistance ($R_{tot}$) value can then be used to more accurately model semiconductor device performance.

More particularly, disclosed herein are embodiments of a computer-implemented method for modeling the resistance of a diffusion region of a semiconductor device, such as a metal oxide semiconductor field effect transistor (MOSFET), a metal oxide semiconductor capacitor (MOS capacitor) or a bipolar transistor, where the diffusion region is contacted by a number N of contacts and the contacts are connected by a wire to a common node line. In the embodiments, a formula for determining total parasitic resistance ($R_{tot}$) associated with the diffusion region of the semiconductor device (e.g., a source region or a drain region of a MOSFET) is developed and stored. This formula can be based on a sum of resistance contributions of from segments of the wire, from the N contacts, and from N partitions of the diffusion region and on electric current flow. Once the formula is developed it can be stored and accessed for later use.

Specifically, the formula can be accessed and, in order to solve the formula, a position of each dividing line between adjacent contacts (i.e., separating adjacent partitions) can be arbitrarily established. That is, the widths of the partitions and/or any one or more of the sub-partitions within the partitions can be arbitrarily established. With the position of each dividing line arbitrarily established, the formula can be used (i.e., solved) in order to determine a first value (i.e., an initial value) for the total parasitic resistance ($R_{tot}$). After this first value is determined, the position of each dividing line can be adjusted in order to achieve a second value for the total parasitic resistance ($R_{tot}$) that is less than the first value. After this second value is determined, the position of each dividing line can again be adjusted in order to achieve a third value for the total parasitic resistance ($R_{tot}$) that is less than the second value and so on. In other words, the position of each dividing line can be iteratively adjusted in order to minimize the final value for the total parasitic resistance ($R_{tot}$) (e.g., in order to find the lowest total parasitic resistance ($R_{tot}$) value). Iteratively adjusting the position of each dividing line is performed in order to account for the fact that electric current flow follows a path of least resistance and, thus, does not necessarily turn within a diffusion region to the closest contact.

Alternatively, rather than iteratively adjusting the position of each dividing line in order to minimize the final value for the total parasitic resistance ($R_{tot}$), partial derivatives of the total parasitic resistance ($R_{tot}$) with respect to the variables in the formula can be used to adjust the position of each dividing line in order to achieve a second value for the total parasitic resistance ($R_{tot}$) that is less than the first value and, more particularly, that is the absolute minimum value for the total parasitic resistance ($R_{tot}$).

Once the minimized total parasitic resistance ($R_{tot}$) value is determined, it can be used to model performance of the semiconductor device.

Also disclosed herein are embodiments of a modeling system. This system can comprise at least a memory that stores the above-described formula and one or more processor(s) that access the formula and perform the above-described modeling method. Also disclosed herein are embodiments of a non-transitory program storage device. This program storage device can be readable by a computer and can tangibly embody a program of instructions that is executable by the computer to perform the above-described modeling method.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments disclosed herein and the various features and advantageous details thereof are explained more fully with reference to the non-limiting embodiments that are illustrated in the accompanying drawings and detailed in the following description.

As mentioned above, diffusion region resistance is one of the largest parasitic resistances that impact the performance of semiconductor devices, such as metal oxide semiconductor field effect transistors (MOSFETs), metal oxide semiconductor capacitors (MOS capacitors), bipolar transistors, etc. Thus, during semiconductor device design, accurate modeling of diffusion region resistance is very important. However, the current techniques used to model the resistance of a multi-contacted diffusion region (i.e., a diffusion region that is contacted by multiple contacts) may result in a relatively large error.

Figure 1:
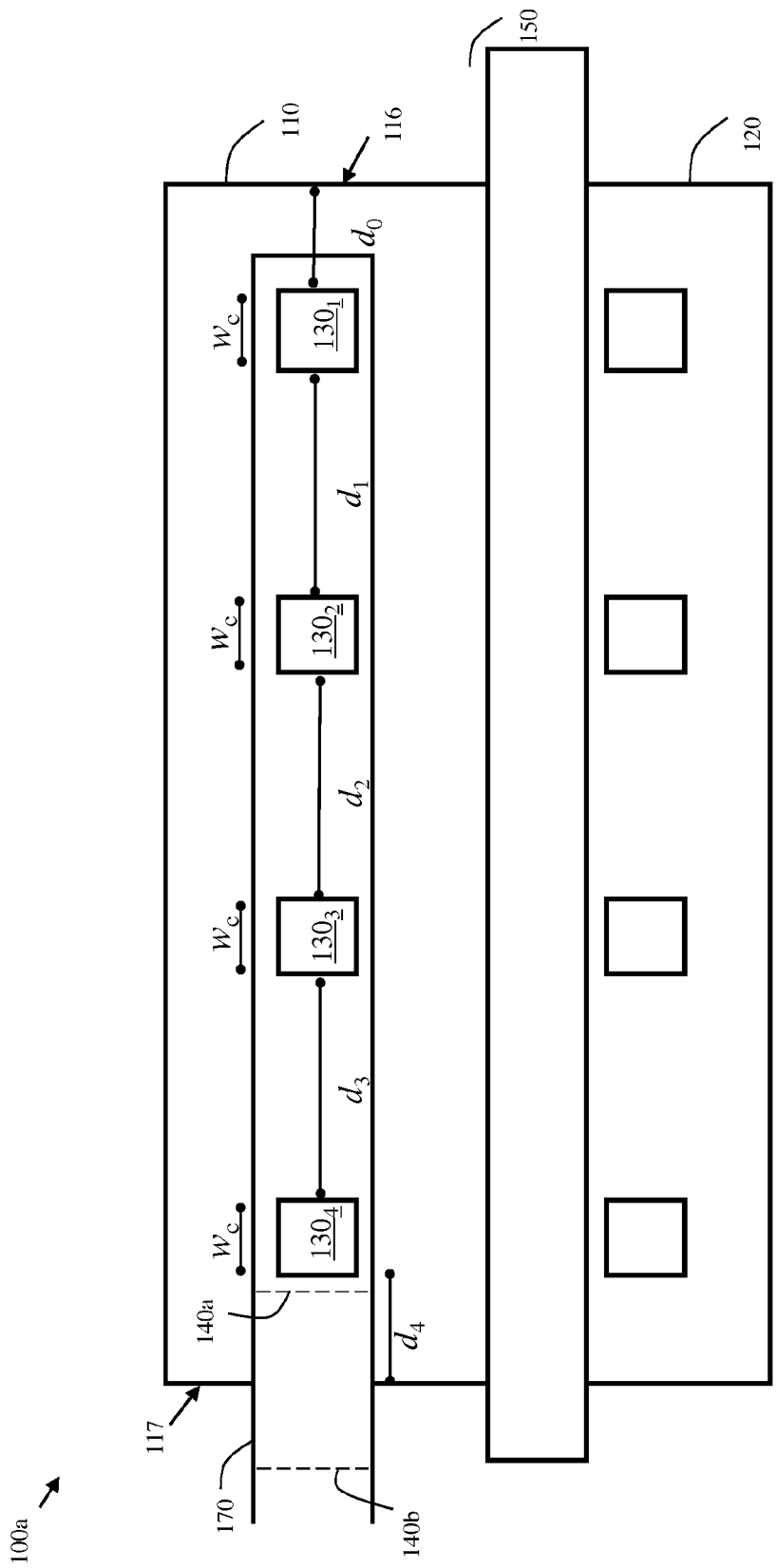
FIG. 1 is a top view diagram illustrating an exemplary multi-contacted diffusion region of a metal oxide semiconductor field effect transistor (MOSFET) device, where the contacts are connected by a wire to a common node line and where the distances between the contacts and the common node line are different.

For example, current techniques for calculating total parasitic resistance ($R_{tot}$) do not take into consideration the resistance associated with a wire connected to each of the contacts in a multi-contacted diffusion region. Specifically, FIG. 1 illustrates an exemplary metal oxide semiconductor field effect transistor (MOSFET) device $100a$ having diffusion regions 110, 120 (i.e., source/drain regions) that are multi-contacted (i.e., contacted by a number N of contacts), see exemplary contacts $130_{1-4}$ in diffusion region 110. Each contact $130_{1-4}$ has essentially the same width ($w_c$). In this example, contact $130_1$ is separated from a first side edge 116 of the diffusion region 110 by a distance $d_0$; contacts $130_1$ and $130_2$ are separated from each other by a distance $d_1$; contacts $130_2$ and contacts $130_3$ are separated from each other by a distance $d_2$; contacts $130_3$ and $130_4$ are separated from each other by a distance $d_3$; and contact $130_4$ is separated from a second side edge 117 of the diffusion region 110 opposite the first side edge 116 by a distance $d_4$. The contacts $130_{1-4}$ are each connected by a wire 170 to a common node line, which can be connected to the wire 170 at a location within the limits of the diffusion region 110 (e.g., see common node line $140a$) or outside the limits of the diffusion region (e.g., see common node line $140b$). In this case the distance between each contact and the common node is different.

Figure 2:
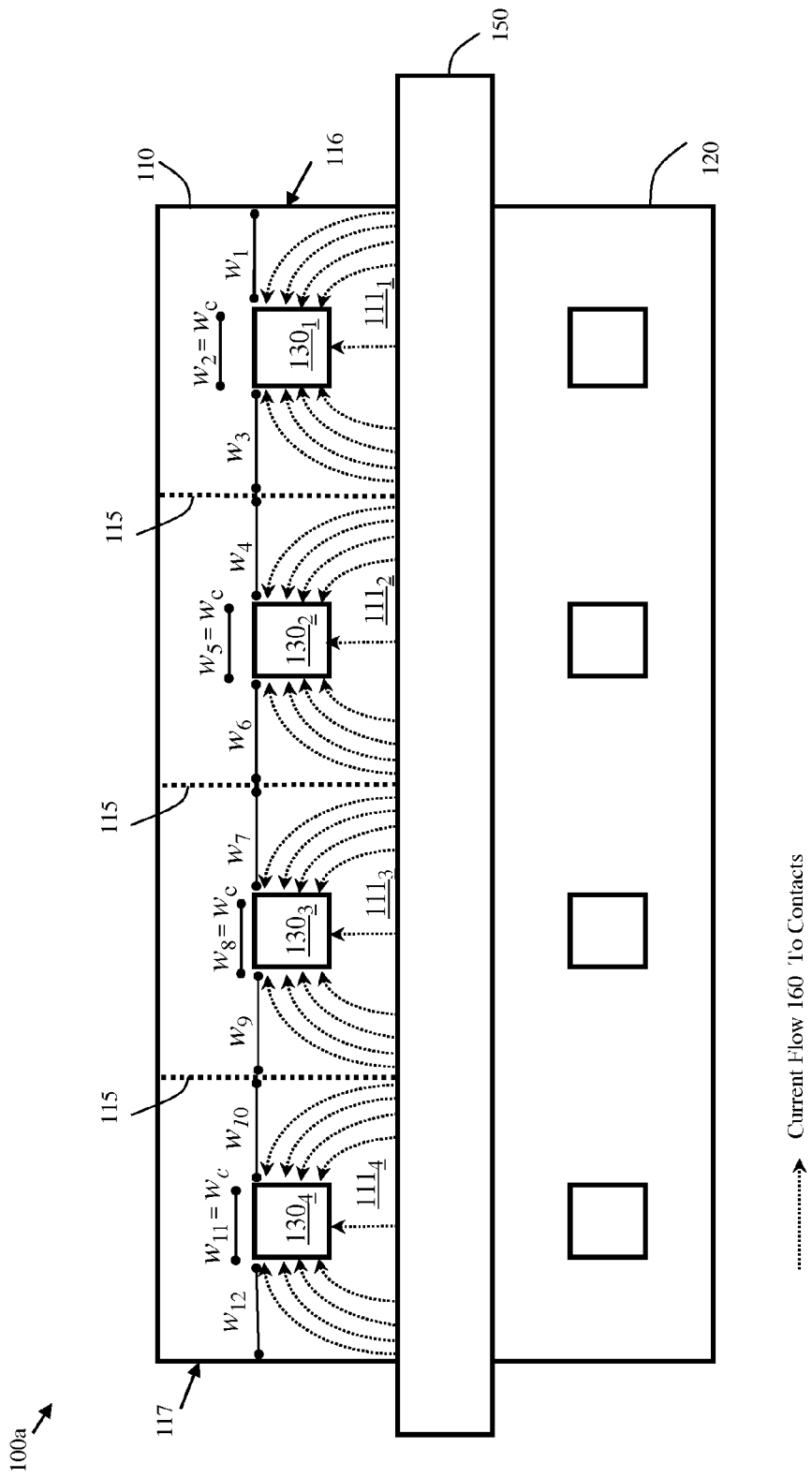
FIG. 2 is a top view diagram illustrating prior art partitioning of the diffusion region of FIG. 1 for purposes of determining parasitic resistance.

Referring to FIG. 2, current techniques for calculating total parasitic resistance ($R_{tot}$) of the diffusion region 110 divide the diffusion region 110 into the same number N of partitions with each partition containing a single one of the N contacts. Thus, in this case there are four partitions, see exemplary partitions $111_{1-4}$. The resistance of each one of the N partitions is then discretely determined and the total parasitic resistance ($R_{tot}$) for that diffusion region is equal to the sum of all the resistances associated with all the N partitions. As shown in FIG. 2, (N-1) dividing lines 115 between the partitions $111_{1-4}$ are typically centered between adjacent contacts such that, for each of the dividing lines 115, the distances to the adjacent contacts are equal. For example, for the dividing line 115 between adjacent contacts $130_1$ and $130_2$, the distance $w_3$ to the contact $130_1$ is equal to the distance $w_4$ to the contact $130_2$; for the dividing line 115 between adjacent contacts $130_2$ and $130_3$, the distance $w_6$ to the contact $130_2$ is equal to the distance $w_7$ to the contact $130_3$; and so on. It should be noted in this FIG. 2 the width $w_c$ of each contact is assigned a specific identifier ($w_c=w_2=w_5=w_8=w_{11}$). Partitioning in this manner assumes that electric current flow 160 through the channel region below the gate 150 and into the diffusion region 110 will turn within the diffusion region 110 towards the closest contact, as shown.

Figure 3:
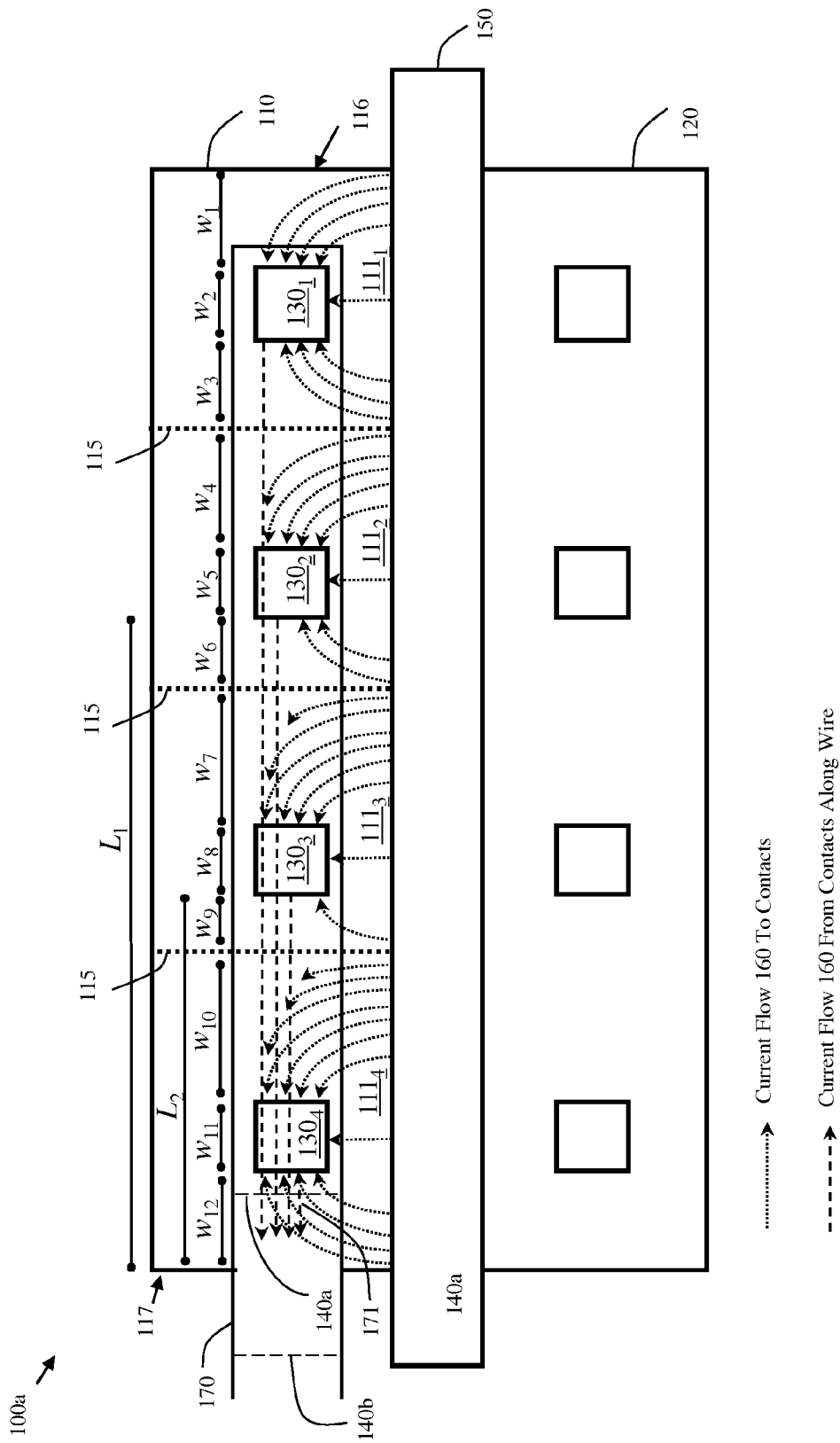
FIG. 3 is a top view diagram illustrating partitioning of the diffusion region of FIG. 1 for purposes of determining parasitic resistance, according to the embodiments disclosed herein.

The Applicant has discovered, however, that this will not always be the case because electric current flow will seek a path with the least resistance. FIG. 3 illustrates how the resistance of the wire 170 of the MOSFET $100a$, which connects to the contacts $130_{1-4}$ and which is asymmetric with respect to those contacts $130_{1-4}$, may impact the path of the electric current flow 160 through the diffusion region 110 to contacts $130_{1-4}$ and along the wire 170. Specifically, a first portion of the path traveled by electric current flow 160 will be from the channel region through the diffusion region 110 to one of the contacts and a second portion of the path traveled by electric current flow 160 will be from the contact along a section of the wire 170 in a given direction 171. As mentioned above, electric current flow will seek the path of least resistance. Thus, given the direction of travel 171 along the wire 170, the shortest path and, thereby the path of least resistance, may actually be one in which electric current flow 160 travels a greater distance to a contact, but as a result travels a shorter distance along the wire 170 to the common node $140a$ or $140b$. For example, electric current flow through the channel region into the portion of the diffusion region 110 between contacts $130_2$ and $130_3$ may turn to contact $130_3$ instead of turning to closer contact $130_2$ because, as a result, the electric current flow will travel a shorter distance $L_2$ along the wire 170 (as opposed to a longer distance $L_1$). Consequently, it would be more accurate, in this case, to partition the diffusion region 110 for purposes of determining resistance so that the partition dividing lines 115 are not centered between the contacts but rather so that $w_3<w_4$, $w_6<w_7$, $w_9<w_{10}$ and also so that $w_3>w_6>w_9$. This is contrary to the assumption made in current techniques which partition so that the partition dividing lines 115 are centered between the contacts and, thereby so that $w_3=w_4$, $w_6=w_7$, and $w_9=w_{10}$.

Figure 4:
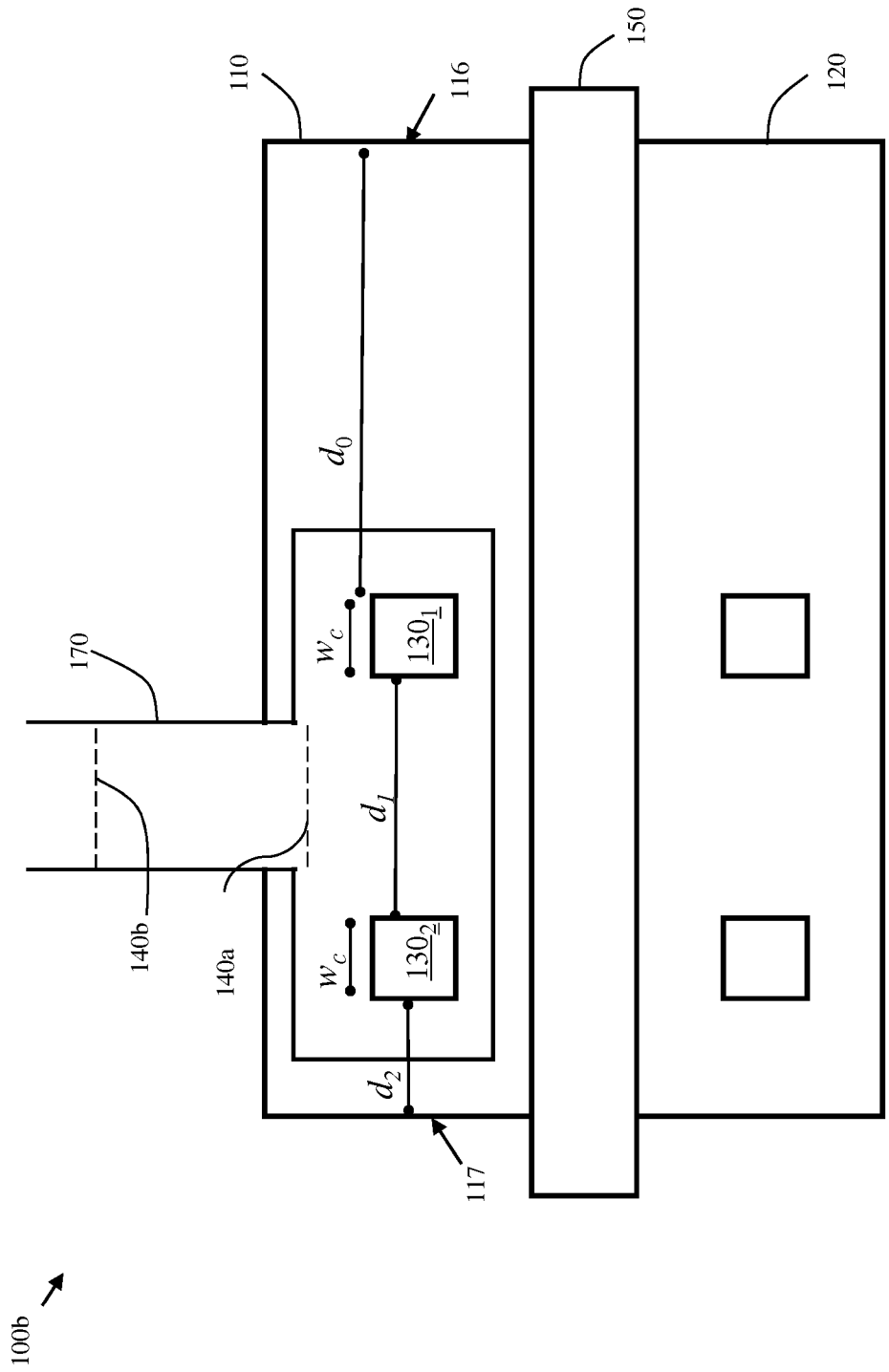
FIG. 4 is a top view diagram illustrating another exemplary multi-contacted diffusion region of a metal oxide semiconductor field effect transistor (MOSFET) device, where the contacts are connected by a wire to a common node line, where the distances between the contacts and the common node line are the same, and where the contacts are asymmetrically placed within the diffusion region.

Additionally, current techniques for calculating total parasitic resistance ($R_{tot}$) also do not take into consideration asymmetric contact placement within the diffusion region and the resulting resistance associated with a greater amount of electric current flow to one contact over another. Specifically, FIG. 4 illustrates another exemplary metal oxide semiconductor field effect transistor (MOSFET) device $100b$ similarly having diffusion regions 110, 120 (i.e., source/drain regions) that are multi-contacted (i.e., contacted by a number N of contacts, N=2 here), see exemplary contacts $130_{1\text{-}2}$. Each contact $130_{1\text{-}2}$ has essentially the same width ($w_c$). However, in this case the contacts $130_{1\text{-}2}$ are asymmetrically placed within the diffusion region 110. That is, contact $130_1$ is separated from a first side edge 116 of the diffusion region 110 by a distance $d_0$; contacts $130_1$ and $130_2$ are separated from each other by a distance $d_1$; and contact $130_2$ is separated from a second side edge 117 of the diffusion region 110 opposite the first side edge 116 by a distance $d_2$, where $d_0 \neq d_2$. The contacts $130_{1\text{-}2}$ are each connected by a wire 170 to a common node line, which can be connected to the wire 170 at a location within the limits of the diffusion region 110 (e.g., see common node line 140$a$) or outside the limits of the diffusion region (e.g., see common node line 140$b$). In this case the distance between each contact and the common node is the same.

Figure 5:
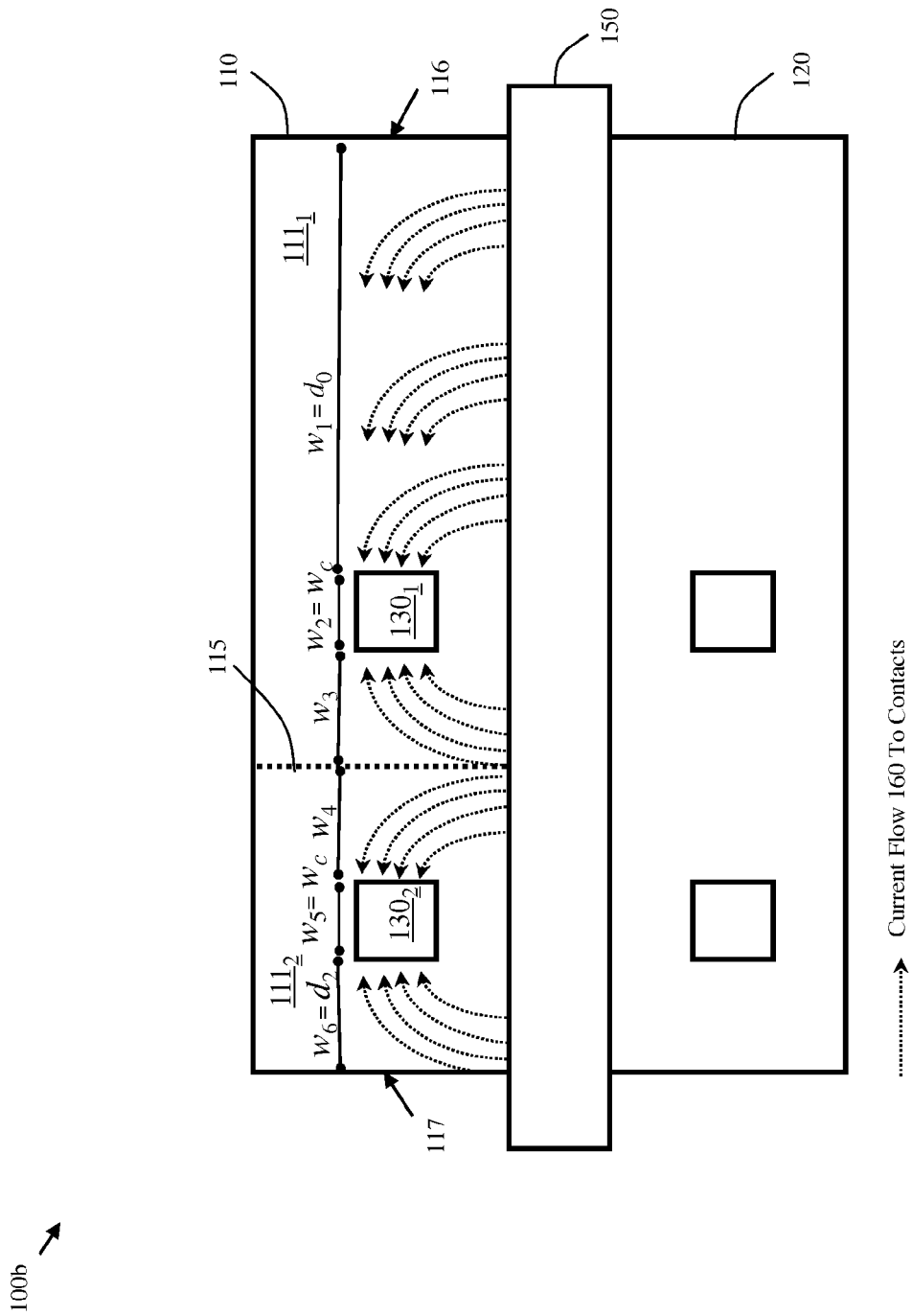
FIG. 5 is a top view diagram illustrating prior art partitioning of the diffusion region of FIG. 4 for purposes of determining parasitic resistance.

Referring to FIG. 5, current techniques for calculating total parasitic resistance ($R_{tot}$) of the diffusion region 110 divide the diffusion region 110 into the same number N of partitions with each partition containing a single one of the N contacts. Thus, in this case there are two partitions, see exemplary partitions $111_{1\text{-}2}$. The resistance of each one of the N partitions is then discretely determined and the total parasitic resistance ($R_{tot}$) for that diffusion region is equal to the sum of all the resistances associated with all the N partitions. As shown in FIG. 5, the one dividing line 115 (N−1) between the partitions $111_{1\text{-}2}$ is typically centered between the contacts such that the distances to the adjacent contacts are equal. That is, for the dividing line 115 between adjacent contacts $130_1$ and $130_2$, the distance $w_3$ to the contact $130_1$ is equal to the distance $w_4$ to the contact $130_2$. It should be noted in this FIG. 5 the width $w_c$ of each contact is assigned a specific identifier ($w_c = w_2 = w_5$). Partitioning in this manner assumes that electric current flow 160 through the channel region below the gate 150 and into the diffusion region 110 will turn within the diffusion region 110 towards the closest contact, as shown.

Figure 6:
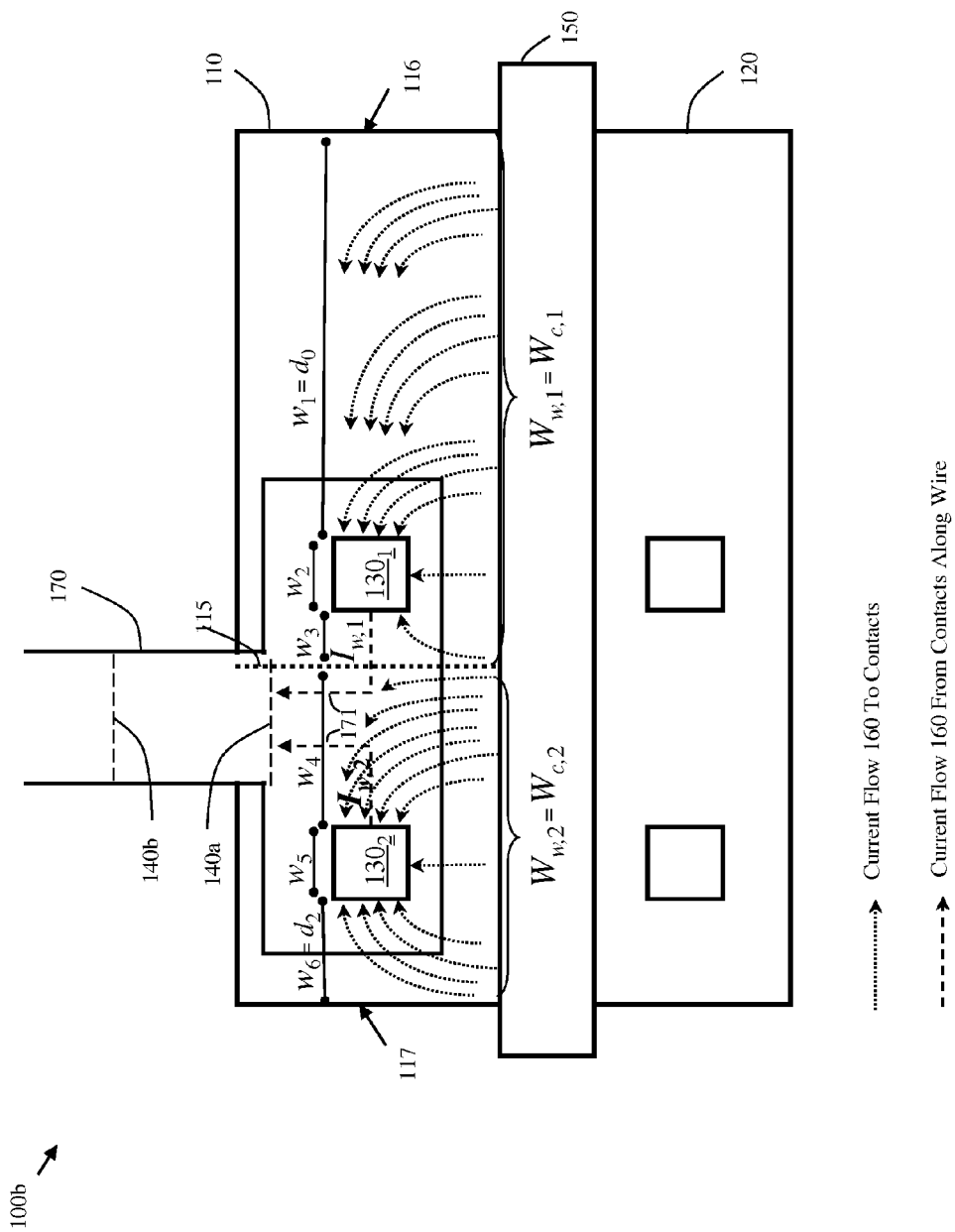
FIG. 6 is a top view diagram illustrating partitioning of the diffusion region of FIG. 4 for purposes of determining parasitic resistance, according to the embodiments disclosed herein.

The Applicant has discovered, however, that this will not always be the case because electric current flow will seek a path with the least resistance. FIG. 6 illustrates how the resistance of the wire 170 of the MOSFET 100$b$, which connects to contacts $130_{1\text{-}2}$ that are asymmetrically placed within the diffusion region 110, may impact the path of the electric current flow 160 through the diffusion region 110 to contacts $130_{1\text{-}2}$. That is, even when a wire 170, which connects contacts (e.g., two contacts $130_{1\text{-}2}$), is symmetric with respect to those contacts $130_{1\text{-}2}$ such that the distance traveled along the wire 170 to the common node will be the same for electric current flow coming from either contact $130_1$ or $130_2$, placement of the contacts $130_{1\text{-}2}$ within the diffusion region may impact the actual path of the electric current flow 160 through the diffusion region 110 to contacts $130_{1\text{-}2}$. Electric current flow from the channel region into a first portion of the diffusion region 110 between the contact $130_1$ and the first side edge 116 will follow a path to the contact $130_1$ and electric current flow from the channel region into a second portion of the diffusion region 110 between the contact $130_2$ and the second side edge 117 will follow a path to the contact $130_2$. However, since the size $d_0$ of the first portion of the diffusion region 110 is greater than the size $d_2$ of the second portion of the diffusion region, the amount of electric current flow to the contact $130_1$ will be greater than the amount of electric current flow to the contact $130_2$. This will impact the path of electric current flow in a third portion of the diffusion region 110 between the two contacts $130_1$ and $130_2$. That is, as mentioned above, electric current flow will seek the path of least resistance. Given that the amount of electric current flow to the contact $130_1$ is already greater than that to the contact $130_2$ due to the difference in sizes ($d_0 > d_2$) of the first and second portions of the diffusion region 110 and further given that increased electric current flow results in a corresponding increase in resistance, the path of least resistance in this case may be one in which the electric current flow 160 from the channel region into the third portion of the diffusion region 110 travels a greater distance to the contact $130_2$ as opposed to the contact $130_1$. Consequently, it would be more accurate, in this case, to partition the diffusion region 110 for purposes of determining resistance so that the partition dividing line 115 is not centered between the contacts $130_1$ and $130_2$ but rather so that $w_3 < w_4$. This is contrary to the prior-art method, as shown in FIG. 5, in which the partition dividing line 115 is centered between the contacts and, thereby so that $w_3 = w_4$.

Given that the current techniques used to model the resistance of a multi-contacted diffusion region do not consider wire resistance when a wire is asymmetric with respect to the contacts and/or do not consider asymmetric contact placement within the diffusion region, those techniques may result in a relatively large error. Thus, the embodiments disclosed below embody new techniques for accounting for wire resistance when determining the total parasitic resistance ($R_{tot}$) associated with a diffusion region of a semiconductor device with asymmetric wire and/or contact placement.

In view of the foregoing, disclosed herein are embodiments of a method, a system, and program storage device for modeling the resistance of a multi-contacted diffusion region of a semiconductor device, such as a metal oxide semiconductor field effect transistor (MOSFET), a metal oxide semiconductor capacitor (MOS capacitor), a bipolar transistor, etc. The embodiments provide a formula for determining the total parasitic resistance ($R_{tot}$) of the diffusion region based on a sum of contributions of wire resistance, contact resistance, diffusion resistance and electric current flow from each of multiple partitions of the diffusion region. Within this formula, the position of each dividing line separating adjacent partitions (i.e., between adjacent contacts) are arbitrarily established and, then, adjusted in order to minimize the total parasitic resistance ($R_{tot}$). Alternatively, partial derivatives of the total parasitic resistance ($R_{tot}$) with respect to the variables in the formula can be used to determine the minimized total parasitic resistance ($R_{tot}$) value. This minimized total parasitic resistance ($R_{tot}$) value can then be used to more accurately model semiconductor device performance.

Figure 7:
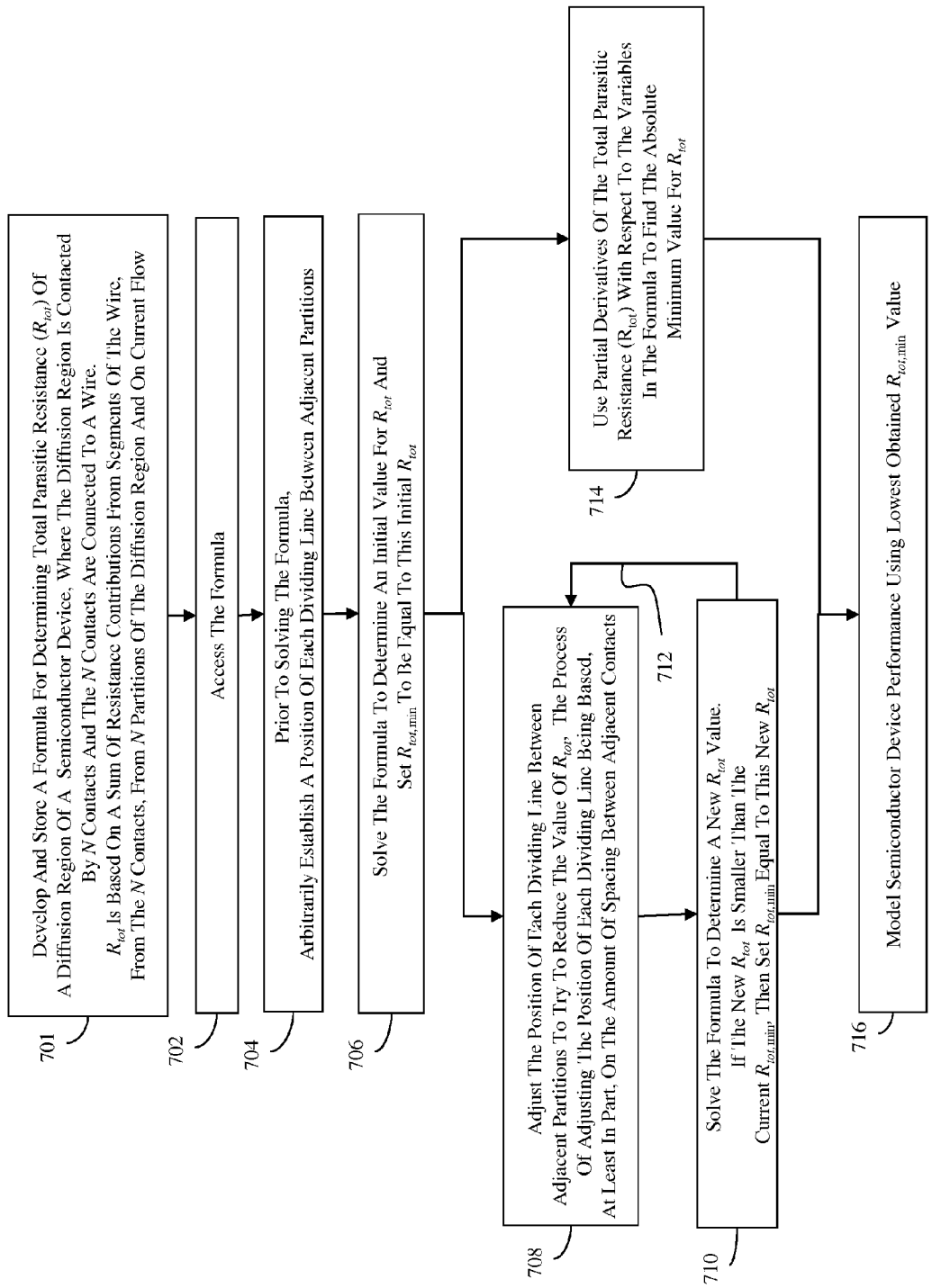
FIG. 7 is a flow diagram illustrating embodiments of a method of determining total parasitic resistance of a multi-contacted diffusion region.

More particularly, referring to FIG. 7, disclosed herein are embodiments of a computer-implemented method for modeling the resistance of a diffusion region of a semiconductor device, such as a metal oxide semiconductor field effect transistor (MOSFET), a metal oxide semiconductor capacitor (MOS capacitor) or a bipolar transistor, where the diffusion region is contacted by a number N of contacts and said contacts are connected by a wire. In the embodiments, a formula for determining total parasitic resistance ($R_{tot}$) associated with the diffusion region of the semiconductor device (e.g., a source region or a drain region of a MOSFET) can be developed and stored (e.g., memory accessible by a computer or processor thereof) (701). This formula can be based on a sum of resistance contributions of from segments of the wire, from the N contacts, from N partitions of the diffusion region and from electric current flow. Once the formula is developed it can be stored and accessed for later use.

For example, consider a MOSFET device 100$a$, such as that described above and illustrated in FIG. 3, comprising a gate structure 150 on a channel region, where the channel region is positioned laterally between diffusion regions (i.e., between a first source/drain region 110 and a second source/drain region 120) and where the diffusion regions 110, 120 are multi-contacted (i.e., contacted by a number N of contacts). The contacts are each connected by a wire 170 to a common node line, which can be connected to the wire 170 at a location within the limits of the diffusion region 110 (e.g., see common node line 140a) or outside the limits of the diffusion region (e.g., see common node line 140b). In this case the distance between each contact and the common node is different. For illustration purposes, the MOSFET 100a is shown with four contacts 130$_{1-4}$; however, it should be understood the embodiments described herein apply to diffusion regions having any number of two or more contacts.

Figure 8:
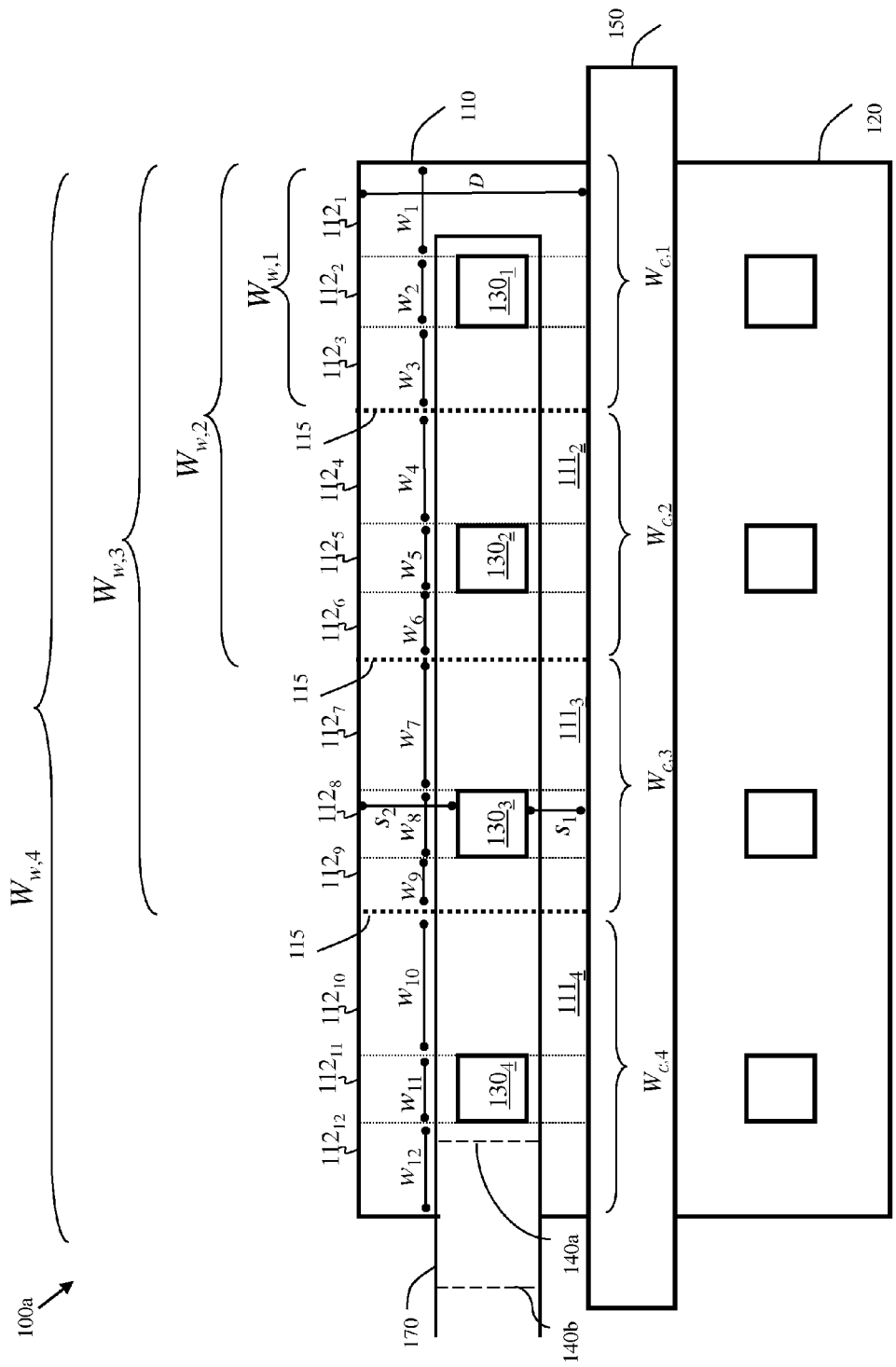
FIG. 8 is a top view diagram further illustrating partitioning of the diffusion region of FIG. 1 for purposes of determining parasitic resistance, according to the embodiments disclosed herein.
Figure 9:
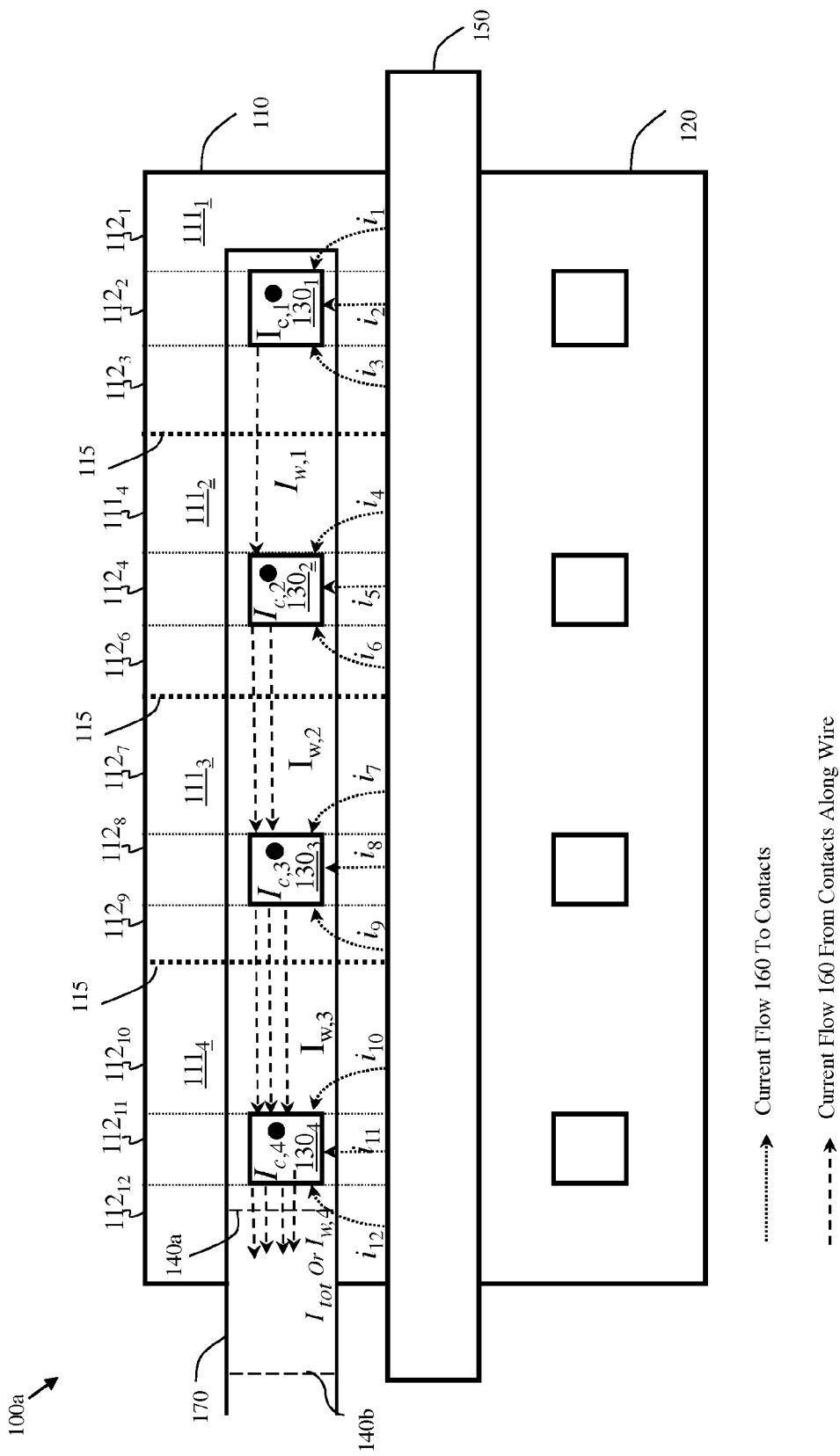
FIG. 9 is a top view diagram further illustrating partitioning of the diffusion region of FIG. 1 for purposes of determining parasitic resistance, according to the embodiments disclosed herein.

As illustrated in FIGS. 8 and 9, the diffusion region 110 of this MOSFET 100a can be divided into a same number N of partitions for purposes of determining the total parasitic resistance ($R_{tot}$) of that diffusion region 110, e.g., see the four partitions 111$_1$-111$_4$. Each of the N partitions will contain a single contact 130$_{1-4}$ and can further be divided into three sub-partitions (e.g., sub-partitions 112$_{1-3}$ of partition 111$_1$; sub-partitions 112$_{4-6}$ of partitions 111$_2$; sub-partitions 112$_{7-9}$ of partition 111$_3$; and sub-partitions 112$_{10-12}$ of partition 111$_4$). Specifically, each partition will include one sub-partition to the right of the contact contained therein, one sub-partition to the left of the contact contained therein, and one sub-partition aligned with the contact contained therein.

If we let the width of a $k^{th}$ sub-partition (k=1, 2, . . . , 3N) be $w_k$, then it is apparent that there are relations among the various sub-partition widths. For example, the total width ($W_{tot}$) of the diffusion region 110 is equal to the sum of N partition widths and is also equal to the sum of 3N sub-partition widths, $$W_{tot} = \sum_{n=1}^{N} W_{c,n} = \sum_{k=1}^{3N} w_k, \quad (1a)$$

where $W_{c,n}$ comprises a width of an $n^{th}$ partition (n=1, 2, . . . N) and is equal to the following:

$$W_{c,n} = w_{3n-2} + w_{3n-1} + w_{3n}, \quad (1b)$$

where $w_{3n-2}$, $w_{3n-1}$ and $w_{3n}$ are equal to the respective widths of the three sub-partitions of the $n^{th}$ partition.

Additionally, between the first contact 111$_1$ (i.e., the most inside contact) and the $N^{th}$ contact 111$_4$ (i.e., the most outside one), there are (N−1) segments of the wire 170. The $1^{st}$ segment of wire is that end segment of wire through which the lowest amount of electric current passes. The $2^{nd}$ segment of wire is adjacent to the $1^{st}$ segment of wire and is that segment of wire through which the next lowest amount of electric current passes and so on with the $(N-1)^{th}$ segment of wire being that segment of wire being that segment of wire through which the greatest amount of electric current passes. Thus, a formula developed for determining the total parasitic resistance ($R_{tot}$) of the diffusion region 110 based on a sum of contributions of wire resistance, contact resistance, diffusion resistance and electric current flow from each of multiple partitions of the diffusion region can comprise the following:

$$R_{tot} = \sum_{k=1}^{3N} \left(\frac{i_k}{I_{tot}}\right)^2 r_{d,k} + \sum_{n=1}^{N} \left(\frac{I_{c,n}}{I_{tot}}\right)^2 R_{c,n} + \sum_n \left(\frac{I_{w,n}}{I_{tot}}\right) R_{w,n}. \quad (2)$$

In this formula, $r_{d,k}$ comprises a contribution of diffusion resistance of a $k^{th}$ sub-partition (k=1, 2, . . . , 3N) (in this case sub-partitions 112$_1$-112$_{12}$, see FIGS. 8 and 9) and $i_k$ comprises a contribution of electric current of a $k^{th}$ sub-partition (k=1, 2, . . . , 3N) (in this case i$_1$-i$_{12}$, see FIG. 9). $R_{c,n}$ comprises a contribution of resistance of an $n^{th}$ contact (n=1, 2, . . . , N) (in this case contacts 130$_1$-130$_4$, see FIGS. 8 and 9) and $I_{c,n}$ comprises a contribution of electric current passing through the $n^{th}$ contact (n=1, 2, . . . , N) (in this case $I_{c,1}$-$I_{c,4}$, see FIG. 9). $R_{w,n}$ comprises a contribution of resistance of an $n^{th}$ segment of wire (n=1, 2, . . . , last wire segment) that connects the $n^{th}$ contact and another contact (see FIG. 1) or connects the $n^{th}$ contact and the common node line of the diffusion region (see FIG. 3), and $I_{w,n}$ comprises a contribution of electric current passing through the $n^{th}$ segment of wire (n=1, 2, . . . , last wire segment) (in this case $I_{w,1}$-$I_{w,4}$, see FIG. 9). Finally, $I_{tot}$ comprises total electric current through the diffusion region 110, or say, $I_{tot}$ comprises electric current through a common node line.

It is then easy to see that there are relations among electric currents. For example, total electric current $I_{tot}$ equals the sum of electric currents $I_{c,n}$ (n=1, 2, . . . , N) passing through N contacts, and it also equals the sum of electric currents $i_k$ (k=1, 2, . . . , 3N) passing through 3N sub-partitions, $$I_{tot} = \sum_{n=1}^{N} I_{c,n} = \sum_{k=1}^{3N} i_k. \quad (3a)$$

Also, the electric currents passing through one contact is equal to the sum of the electric current passing through its 3 sub-partitions, $$I_{c,n} = i_{3n-2} + i_{3n-1} + i_{3n}, \, n=1, 2, \ldots, N. \quad (3b)$$

The relation between the electric current $I_{w,n}$ passing through the $n^{th}$ wire segment and the electric currents passing through contacts $I_{c,k}$ (k=1, 2, . . . , N) depends on how contacts are connected by all wire segments and the location of wire's output. For the layout shown in FIG. 1, $$I_{w,n} = \sum_{k=1}^{n} I_{c,k}, \quad n = 1, 2, \ldots, N-1. \quad (3c)$$

For the layout shown in FIG. 4, $$I_{w,n} = I_{c,n}, \, n=1,2. \quad (3d)$$

(See also FIG. 6.)

Furthermore, when all sub-partition 112$_{1-12}$ widths $w_k$ (k=1, 2, . . . , 3N) (in this case $w_1$-$w_{12}$, see FIG. 8) are much smaller than a characteristic width value $w_0$ (which depends on FET current and voltage Vdd, etc.), the electric current $i_k$ is proportional to the width $w_k$ of the $k^{th}$ sub-partition. That is, $$i_k \propto w_k, \, w_k << w_0, \, k=1,2,\ldots,3N. \quad (4)$$

Thus, the ratio of an electric current to the total electric current $I_{tot}$ is equal to the ratio of a corresponding partition/sub-partition width to the FET electric width $W_{tot}$. That is, $$\frac{i_k}{I_{tot}} = \frac{w_k}{W_{tot}}, \quad (5a)$$

$$\frac{I_{c,n}}{I_{tot}} = \frac{W_{c,n}}{W_{tot}}, \quad (5b)$$

$$\frac{I_{w,n}}{I_{tot}} = \frac{W_{w,n}}{W_{tot}}, \quad (5c)$$

where $W_{w,n}$ is the sum of widths of sub-partitions whose electric current passes through the $n^{th}$ wire segment. The relation between the width $W_{w,n}$ passing through the $n^{th}$ wire segment and widths $W_{c,n}$ (n=1, 2, ..., N) depends on how contacts are connected by all wire segments and the location of wire's output.

For the exemplary MOSFET 100*a*, shown in FIG. 3, $$W_{w,n} = \sum_{k=1}^{n} W_{c,k} = \sum_{k=1}^{n} (w_{3k-2} + w_{3k-1} + w_{3k}) = \sum_{k=1}^{3n} w_k = w_1 + nw_c + \sum_{m=1}^{n-1} d_m + w_{3n}, n = 1, 2, \ldots, N-1, \quad (6a)$$

and $$d_m = w_{3m} + w_{3m+1}, m = 1, 2, \ldots, N-1, \quad (6b)$$

where $W_{w,n}$ is the width from the beginning of the 1$^{st}$ partition 111$_1$ to the end of the $n^{th}$ partition 111$_4$, and where $d_m$ is the distance between the $m^{th}$ contact and the $(m+1)^{th}$ contact, and $w_2 = w_5 = w_8 = \ldots = w_c$, as shown in FIG. 8, is the width of a contact. Consequently, the formula for the total resistance of the diffusion region 110 ($R_{tot}$) can be simplified as follows:

$$R_{tot} = \sum_{k=1}^{3N} \left(\frac{w_k}{W_{tot}}\right)^2 r_{d,k} + \sum_{n=1}^{N} \left(\frac{W_{c,n}}{W_{tot}}\right)^2 R_{c,n} + \sum_{n=1}^{N-1} \left(\frac{W_{w,n}}{W_{tot}}\right)^2 R_{w,n} = \frac{1}{W_{tot}^2} \left( \sum_{k=1}^{3N} w_k^2 r_{d,k}(w_k; s_1, D, s_2) + \sum_{n=1}^{N} (w_{3n-2} + w_{3n-1} + w_{3n})^2 R_{c,n} + \sum_{n=1}^{N-1} W_{w,n}^2 R_{w,n} \right). \quad (7)$$

Whereas, for the exemplary MOSFET 100*b*, as shown in FIG. 6, $$W_{w,n} = W_{c,n}, n=1,2.$$

The formula for the total parasitic resistance ($R_{tot}$) of the diffusion region 110 for N=2 becomes:

$$R_{tot} = \sum_{k=1}^{3N} \left(\frac{w_k}{W_{tot}}\right)^2 r_{d,k} + \sum_{n=1}^{N} \left(\frac{W_{c,n}}{W_{tot}}\right)^2 R_{c,n} + \sum_{n=1}^{N} \left(\frac{W_{w,n}}{W_{tot}}\right)^2 R_{w,n} = \frac{1}{W_{tot}^2} \left( \sum_{k=1}^{3N} w_k^2 r_{d,k}(w_k; s_1, D, s_2) + \sum_{n=1}^{N} (w_{3n-2} + w_{3n-1} + w_{3n})^2 R_{c,n} + \sum_{n=1}^{N} W_{w,n}^2 R_{w,n} \right). \quad (8)$$

Once the formula is developed, it can be stored (e.g., in a memory accessible by a computer or, more particularly, a processor thereof) for later use.

Formula (7) or (8) can then be accessed (702) and, in order to solve the formula, a position of each dividing line between adjacent contacts (i.e., separating adjacent partitions) can be arbitrarily established (e.g., by the processor) (704). That is, the widths of the partitions and/or any one or more of the sub-partitions within the partitions can be arbitrarily established, thereby making the resistance model somewhat general. For example, in the case of the MOSFET 100*b* discussed above and illustrated in FIGS. 8 and 9, the diffusion resistance of a sub-partition which faces a contact directly (e.g., see sub-partitions 112$_2$, 112$_5$, 112$_8$ and 112$_{11}$) can be written as follows:

$$r_{d,3n-1} = \frac{R_s s_1}{w_{3n-1}} = \frac{R_s s_1}{w_c}, n = 1, 2, \ldots, N. \quad (9a)$$

Whereas, the resistance of a sub-partition which does not face a contact directly (e.g., see sub-partitions 112$_1$ and 112$_3$, 112$_4$ and 112$_6$, 112$_7$ and 112$_9$, and 112$_{10}$ and 112$_{12}$) can be written as follows:

$$r_{d,k} = f(w_k; s_1, D, s_2), k=3n-2, 3n, n=1, 2, \ldots, N. \quad (9b)$$

With the position of each dividing line arbitrarily established, the formula can be used (e.g., by the processor) in order to determine a first value (i.e., an initial value) for the total parasitic resistance ($R_{tot}$) (706). After this first value is determined, the position of each dividing line can be adjusted (e.g., by the processor) in order to achieve a second value for the total parasitic resistance ($R_{tot}$) and, if the second value is less than the first value, the second value can be set as the minimized total parasitic resistance ($R_{tot, min}$) (708). If the second value is greater than the first value, the process can be repeated (i.e., the position of the dividing line can be adjusted) until a second value that is less than the first value is found. After a second value is set as $R_{tot, min}$, the position of each dividing line can again be adjusted (e.g., by the processor) in order to achieve a third value for the total parasitic resistance ($R_{tot}$) (i.e., a new value for $R_{tot}$) and, if this third value is less than the current $R_{tot,min}$, $R_{tot,min}$ can be reset to the third value and so on (710 and 712). In other words, the position of each dividing line can be iteratively adjusted (e.g., by the computer or processor) in order to minimize the final value for the total parasitic resistance ($R_{tot}$) (i.e., in order to find for the lowest the total parasitic resistance ($R_{tot}$) value). The process of iteratively adjusting the position of each dividing line is performed in order to account for the fact that electric current flow follows a path of least resistance and, thus, does not necessarily turn within a diffusion region to the closest contact. That is, it is performed in order to minimize the total parasitic resistance ($R_{tot}$) with respect to the widths of N partitions.

Specifically, while the sum of the widths of the N partition is a fixed value (FET width), there are (N−1) independent variables. Those variables can be $w_{3n}$, n=1, 2, ..., N−1. The minimization of total parasitic resistance ($R_{tot}$) with respect to (N−1) independent variables can be expressed as, $$R_{tot,min} = \min\{R_{tot}(w_3, w_6, w_9, \ldots, w_{3(N-1)})\}. \quad (10)$$

Those skilled in the art will recognize that there are many techniques that can be used to minimize a multi-variable function, such as the resistance formula above for the total parasitic resistance ($R_{tot}$) of a multi-contacted diffusion region. As discussed above, one technique involves iteratively adjusting the position of the dividing lines by adjusting the partitions widths. That is, one starts from a set of initial partition width values and calculates the corresponding total resistance value. Next, one tries a different set of partition width values and determines whether a lower resistance value is obtained. If yes, then one retains this set of partition width values and the corresponding resistance value as the new lower resistance value. If not, one discards this set of values. After many trials, one uses the lowest resistance value as the final parasitic resistance value.

Alternatively, rather than iteratively adjusting the position of each dividing line in order to minimize the final value for the total parasitic resistance ($R_{tot}$), partial derivatives of the total parasitic resistance ($R_{tot}$) with respect to the variables in the formula can be used to adjust the position of each dividing line in order to achieve a second value for the total parasitic resistance ($R_{tot}$) that is less than the first value and, more particularly, that is the absolute minimum value for the total parasitic resistance ($R_{tot}$) (714). Specifically, since there is an analytic expression for the total parasitic resistance ($R_{tot}$) as a function of (N−1) independent variables $w_3, w_6, w_9, \ldots, w_{3(N-1)}$, the minimum resistance value ($R_{tot, min}$) is found be setting each of the following (N−1) partial derivatives can be set to zero:

$$\frac{\partial R_{tot}}{\partial w_{3n}} = 0, n = 1, 2, \ldots, N-1. \tag{11}$$

As a result, $$\frac{d(w_{3n}^2 r_{d,3n})}{dw_{3n}} - \frac{d(w_{3n+1}^2 r_{d,3n+1})}{dw_{3n+1}} + 2(w_{3n-2} + w_{3n-1} + w_{3n})R_{c,n} - \tag{12}$$
$$2(w_{3n+1} + w_{3n+2} + w_{3n+3})R_{c,n+1} + 2W_n R_{w,n} =$$
$$0, n = 1, 2, \ldots, N-1.$$

Thus, for closely spaced contacts (e.g., contacts separated by a distance of twice of diffusion region width, 2D, or less when a diffusion region is connected to one functioning FET channel, or contacts separated by a distance of one diffusion region width, D, or less when a diffusion region is connected to two functioning FET channels), the following set of expressions can be used. When $w_{3n}$ and $w_{3n+1}$ are very small, $$w_{3n}^2 r_{d,3n} = R_s s_1 w_{3n} + r_0 w_{3n}^2, w_{3n} << D-s_1, \tag{13a}$$

and $$w_{3n+1}^2 r_{d,3n+1} = R_s s_1 w_{3n+1} + r_0 w_{3n+1}^2, w_{3n+1} << D-s_1, \tag{13b}$$

where $$r_0 = \frac{2R_s \ln 2}{\pi}. \tag{14}$$

Furthermore, if equations 13(a) and 13(b) are substituted into equation (12), then $$-R_{c,n} x_{n-1} + (2r_0 + R_{c,n} + R_{c,n+1} + R_{w,n}) x_n - R_{c,n+1} x_{n+1} = \tag{15}$$
$$r_0 d_n - d_{n-1} R_{c,n} + d_n R_{c,n+1} + w_c (R_{c,n+1} - R_{c,n}) -$$
$$R_{w,n}\left(w_1 + n w_c + \sum_{k=1}^{n-1} d_k\right), n = 1, 2, \ldots, N-1,$$

when $$d_0 = w_1, w_0 = 0, \tag{16}$$

and $$x_n = w_{3n}, n = 0, 1, 2, \ldots, N. \tag{17}$$

It should be noted that $x_N = w_{3N}$ is not a variable here. Equation (15) is a set of (N−1) linear algebraic equations for (N−1) unknowns, $x_1, x_2, \ldots, x_{N-1}$ and their solution can be found easily. When all contact resistances are identical, then $$R_{c,n} = R_c, n=1,2,\ldots,N, \tag{18}$$

and equation (15) can be simplified as follows:

$$-R_c x_{n-1} + (2r_0 + 2R_c + R_{w,n}) x_n - R_c x_{n+1} = \tag{19}$$
$$r_0 d_n + (d_n - d_{n-1})R_c - R_{w,n}\left(w_1 + n w_c + \sum_{k=1}^{n-1} d_k\right),$$
$$n = 1, 2, \ldots, N-1.$$

When all contact-to-contact distances are the same and wire width is the same, $$\text{then } d_n = d, R_{w,n} = R_w, n=1,2,\ldots,N-1, \tag{20}$$

and equation (19) can further be simplified as follows:

$$(2r_0 + 2R_c + R_w)x_1 - R_c x_2 = (r_0 + R_c)d - w_1 R_c - R_w(w_1 + w_c), \tag{21a}$$

$$-R_c x_{n-1} + (2r_0 + 2R_c + R_w)x_n - R_c x_{n+1} = r_0 d - R_w[w_1 + n w_c + (n-1)d], n=2,\ldots,N-2, \tag{21b}$$

and $$-R_c x_{N-2} + (2r_0 + 2R_c + R_w)x_{N-1} = R_c w_{3N} + r_0 d - R_w[w_1 + (N-1)w_c + (N-2)d], N \geq 3. \tag{21c}$$

When there are only two contacts (i.e., N=2) in a diffusion region, then equation (21a) gives a partition width which minimizes the $R_{tot}$ and $$w_3 = x_1 = \frac{d}{2} + \frac{R_c(w_6 - w_1) - R_w(w_1 + w_c + d/2)}{2r_0 + 2R_c + R_w}. \tag{22}$$

When the wire resistance $R$, is much smaller than the contact resistance $R_c$ and $r_0$, $x_1 \neq d/2$ if $w_1 \neq w_6$. Namely, the locations of contacts also have an effect on the electric current flow and thus on the division line between two neighboring contacts. When the layout of two contacts is symmetric, a simpler solution is as follows:

$$w_3 = x_1 = \frac{d}{2} - \frac{R_w W_{tot}}{2(2r_0 + 2R_c + R_w)}, w_1 = w_6. \tag{23}$$

When the wire resistance is much smaller than the contact resistance and/or $r_0$, the partition approaches the middle of two contacts, $w_3 \rightarrow \frac{1}{2}d$, $w_1 = w_6$, $R_w << 2(r_0 + R_c)$, as expected.

When there are 3 contacts (i.e., N=3) in a diffusion region, equations (21a)-(21c) can contain two equations, as follows:

$$(2r_0 + 2R_c + R_w)x_1 - R_c x_2 = (r_0 + R_c)d - w_1 R_c - R_w(w_1 + w_c), \quad (24a)$$

and $$-R_c x_1 + (2r_0 + 2R_c + R_w)x_2 = R_c w_9 + r_0 d - R_w(w_1 + 2w_c + d). \quad (24b)$$

Consequently, $$x_1 + x_2 = d + \frac{R_c(w_9 - w_1) - R_w(2w_1 + 3w_c + 2d)}{2r_0 + R_c + R_w}, \quad (25a)$$

$$x_1 - x_2 = \frac{R_c(d - w_1 - w_9) + R_w(w_c + d)}{2r_0 + 3R_c + R_w}. \quad (25b)$$

and equation (25b) tells us that $x_1 > x_2$, when $d = w_1 + w_9$.

Furthermore, when the layout of the contacts are symmetric (e.g., when $w_1 = w_9 = d/2$), the equations (25a)-(25b) can be simplified as follows:

$$x_1 + x_2 = d - \frac{3R_w(w_c + d)}{2r_0 + R_c + R_w}, \text{ and } x_1 - x_2 = \frac{R_w(w_c + d)}{2r_0 + 3R_c + R_w}.$$

Consequently, $$x_1 = \frac{d}{2} - \frac{R_w W_{tot}}{3} \frac{2r_0 + 4R_c + R_w}{(2r_0 + 3R_c + R_w)(2r_0 + R_c + R_w)},$$

and $$x_2 = \frac{d}{2} - \frac{R_w W_{tot}}{3} \frac{4r_0 + 5R_c + 2R_w}{(2r_0 + 3R_c + R_w)(2r_0 + R_c + R_w)},$$

where $w_c + d = W_{tot}/3$.

When there are N contacts ($N \geq 4$) in a diffusion region (e.g., as shown in FIGS. 8 and 9) with $w_1 = w_{3N} = d/2$, then the approximate solutions of equations (21a)-(21c) can be found as follows:

$$w_{3n} = x_n = \frac{d}{2} - \frac{nR_w W_{tot}}{N(2r_0 + R_w)}, \, n = 1, 2, 3, \ldots, N-2, \quad (26a)$$

and $$w_{3(N-1)} = x_{N-1} = \frac{d}{2} - \frac{R_w W_{tot}}{N(2r_0 + R_w)}\left(N\frac{2r_0 + R_c + R_w}{2r_0 + 2R_c + R_w} - 1\right). \quad (26b)$$

Therefore, it is easy to see that $w_3 > w_6 > w_9 > \ldots > w_{3(N-1)}$. When the wire resistance is much smaller than $r_0$, the partition approaches to be in the middle, $w_{3n} \to \frac{1}{2}d$, $w_1 = w_{3N} = \frac{1}{2}d$, $R_w \ll 2r_0$, as expected.

Alternatively, for sparsely placed contacts (e.g., contacts separated by a distance of twice of diffusion region width, 2D, or more when a diffusion region is connected to one functioning FET channel, or contacts separated by a distance of one diffusion region width, D, or more when a diffusion region is connected to two functioning FET channels), the following set of expressions can be used. When $w_{3n}$ and $w_{3n+1}$ are large (but not too large), $$w_{3n}^2 r_{d,3n} = \frac{R_s w_{3n}^3}{3D} + r_a w_{3n}^2, \, \eta D < w_{3n} < w_0, \quad (27a)$$

and $$w_{3n}^2 r_{d,3n+1} = \frac{R_s w_{3n+1}^3}{3D} + r_a w_{3n+1}^2, \, \eta D < w_{3n+1} < w_0, \quad (27b)$$

where $w_0$ is a characteristic width of the FET (which depends on FET's parasitic on-current and Vdd, etc.), and $r_a$ is independent of sub-partition widths. Equations (27a)-(27b) can be substituted into equation (12) and further using equation (16) and (17), the following formulas can be obtained:

$$-R_{c,n}x_{n-1} + (2R_{0,n} + R_{c,n} + R_{c,n+1} + R_{w,n})x_n - R_{c,n+1}x_{n+1} \quad (28)$$
$$= R_{0,n}d_n - d_{n-1}R_{c,n} + d_n R_{c,n+1} + w_c(R_{c,n+1} - R_{c,n}) -$$
$$R_{w,n}\left(w_1 + nw_c + \sum_{k=1}^{n-1} d_k\right), \, n = 1, 2, \ldots, N-1,$$

where $$R_{0,n} = r_a + \frac{R_s d_n}{2D}. \quad (29)$$

Equation (28) is a set of (N-1) linear algebraic equations for (N-1) unknowns, $x_1, x_2, \ldots, X_{N-1}$. Their solution can be found easily. When all contact resistances are identical (i.e., when they satisfy equation (18), equation (28) reduces to the following:

$$-R_c x_{n-1} + (2R_0 + 2R_c + R_{w,n})x_n - R_c x_{n+1} = \quad (30)$$
$$R_0 d_n + (d_n - d_{n-1})R_c - R_{w,n}\left(w_1 + nw_c + \sum_{k=1}^{n-1} d_k\right),$$
$$n = 1, 2, \ldots, N-1,$$

where $$R_0 = r_a + \frac{1}{2}R_s d / D.$$

It should be noted that equation (30) is very similar to equation (15) with a mapping relation $R_0 \leftrightarrow r_0$. Under further condition equation (20), equations (21)-(26) are also valid for sparsely placed contacts after replacing $r_0$ by $R_0$.

Alternatively, when some contact distances are very small but some are large, equations (28) and (29) can be used. One only needs to replace a $R_{0,n}$ by $r_0$ when a corresponding $d_n$ is very small. Whereas, when the contact distances are arbitrary, analytic expressions for $d(w_{3n}^2 r_{d,3n})/dw_{3n}$ and $d(w_{3n+1}^2 r_{d,3n+1})/dw_{3n+1}$ in equation (12) can be obtained easily. Then, numerical method can be use to find solutions for $w_{3n}$, n=1, 2, . . . , N-1.

Once the minimized total parasitic resistance ($R_{tot}$) value is determined, it can be used to model performance of the semiconductor device (716). Techniques for modeling semiconductor device performance using, as one of multiple different parameters, values for total parasitic resistance ($R_{tot}$) of diffusion regions (e.g., of a source region and of a drain region of a MOSFET) are well-known in the art. Thus, the details of such modeling techniques are omitted from this specification in order to allow the reader to focus on the salient aspects of the embodiments disclosed herein.

Also disclosed herein are embodiments of a system and a program storage device for modeling the resistance of a multi-contacted diffusion region of a semiconductor device. The system can comprise a memory that stores the above-described formula and at least one processor that can access the formula and perform the above-described modeling method. The program storage device can be readable by a computer and can tangibly embody a program of instructions that executable by the computer to perform the above described modeling method.

More particularly, as will be appreciated by one skilled in the art, aspects of the disclosed modeling technique may be embodied as a method, a system or program storage device (i.e., a computer program product). Accordingly, aspects of the disclosed modeling technique may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed modeling technique may take the form of a computer program product embodied in one or more computer readable medium(s) having computer readable program code embodied thereon.

Any combination of one or more computer readable medium(s) may be utilized. The computer readable medium may be a non-transitory computer readable storage medium or computer readable signal medium.

A computer readable storage medium may be, for example, but is not limited to, an electronic, magnetic, optical, electro-magnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed modeling technique are described with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 10:
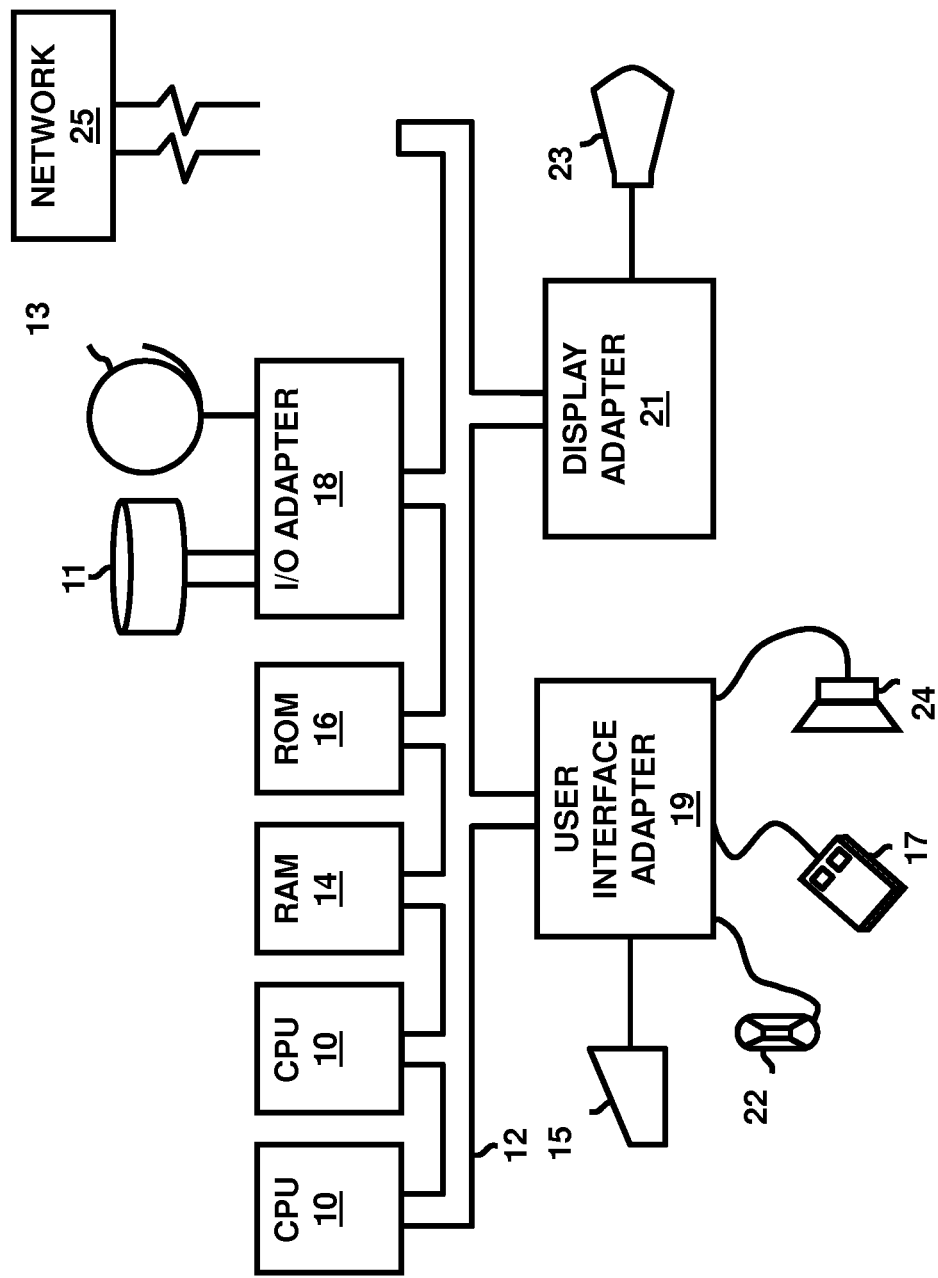
FIG. 10 is an exemplary hardware environment that can be used to implement the disclosed embodiments.

A representative hardware environment for practicing the disclosed embodiments is depicted in FIG. 10. This schematic drawing illustrates a hardware configuration of an information handling/computer system in accordance with the disclosed embodiments. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology disclosed. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description above has been presented for purposes of illustration and description, but is not intended to be exhaustive or limited to the embodiments in the form disclosed. Many modifications and variations to the disclosed embodiments will be apparent to those of ordinary skill in the art without departing from the scope and spirit of the disclosed embodiments.

Therefore, disclosed above are embodiments of a method and program storage device for modeling the resistance of a multi-contacted diffusion region of a semiconductor device, such as a metal oxide semiconductor field effect transistor (MOSFET), a metal oxide semiconductor capacitor (MOS capacitor), a bipolar transistor, etc. The embodiments provide a formula for determining the total parasitic resistance ($R_{tot}$) of the diffusion region based on a sum of contributions of wire resistance, contact resistance, diffusion resistance and electric current flow from each of multiple partitions of the diffusion region. Within this formula, the position of each dividing line separating adjacent partitions (i.e., between adjacent contacts) are arbitrarily established and, then, iteratively adjusted in order to minimize the total parasitic resistance ($R_{tot}$). Alternatively, partial derivatives of the total parasitic resistance ($R_{tot}$) with respect to the variables in the formula can be used to determine the minimized total parasitic resistance ($R_{tot}$) value. This minimized total parasitic resistance ($R_{tot}$) value can then be used to more accurately model semiconductor device performance.

What is claimed is:

1. A modeling method comprising:
   accessing, by a computer from a memory, a formula for determining total parasitic resistance ($R_{tot}$) associated with a diffusion region of a semiconductor device, said diffusion region being contacted by a number N of contacts, said contacts being connected by a wire to a common node line and said formula being based on a sum of resistance contributions from segments of said wire, from said N contacts, and from N partitions of said diffusion region and on electric current flow;
   arbitrarily establishing, by said computer, a position of each dividing line separating adjacent partitions, said position being between adjacent contacts;
   using, by a computer, said formula to determine a first value for said total parasitic resistance given said position of each dividing line; and
   iteratively adjusting, by said computer, said position of each dividing line in order to achieve a second value for said total parasitic resistance ($R_{tot}$) that is less than said first value.

2. The modeling method of claim 1, further comprising modeling performance of said semiconductor device based on said second value.

3. The method of claim 1, said iteratively adjusting being performed so as to account for said electric current flow following a path of least resistance.

4. The modeling method of claim 1, said arbitrarily establishing of said position of each dividing line comprising arbitrarily establishing widths of at least some sub-partitions of said partitions.

5. The modeling method of claim 1, said formula comprising:

$$R_{tot} = \sum_{k=1}^{3N} \left(\frac{i_k}{I_{tot}}\right)^2 r_{d,k} + \sum_{n=1}^{N} \left(\frac{I_{c,n}}{I_{tot}}\right)^2 R_{c,n} + \sum_{n} \left(\frac{I_{w,n}}{I_{tot}}\right) R_{w,n},$$

where said diffusion region is divided into N partitions equal to a same number N of contacts to said diffusion region,
where each of said N partitions is further divided into three sub-partitions such that said diffusion region comprises 3N sub-partitions, where $r_{d,k}$ comprises a contribution of diffusion resistance of a $k^{th}$ sub-partition (k=1, 2, ..., 3N),
where $i_k$ comprises a contribution of electric current of a $k^{th}$ sub-partition (k=1, 2, ..., 3N),
where $R_{c,n}$ comprises a contribution of resistance of an $n^{th}$ contact (n=1, 2, ..., N),
where $I_{c,n}$ comprises a contribution of electric current passing through said $n^{th}$ contact (n=1, 2, ..., N),
where $R_{w,n}$ comprises a contribution of resistance of an $n^{th}$ segment of wire (n=1, 2, ..., last wire segment) that connects said $n^{th}$ contact to any one of an adjacent contact and said common node line,
where $I_{w,n}$ comprises a contribution of electric current passing through said $n^{th}$ segment of wire (n=1, 2, ..., last wire segment),
where $I_{tot}$ comprises total electric current through said diffusion region of a total width $W_{tot}$.

6. The modeling method of claim 5, wherein said total width ($W_{tot}$) of said diffusion region equals a sum of widths of said N partitions and further equals a sum of widths of said 3N sub-partitions, $$W_{tot} = \sum_{n=1}^{N} W_{c,n} = \sum_{k=1}^{3N} w_k,$$

where $w_k$ comprises a width of a $k^{th}$ sub-partition (k=1, 2, ..., 3N) and where $W_{c,n}$ comprises a width of an $n^{th}$ partition (n=1, 2, ..., N) and is equal to the following:

$W_{c,n}=w_{3n-2}+w_{3n-1}+w_{3n}$, with $w_{3n-2}$, $w_{3n-1}$ and $w_{3n}$ being equal to the respective widths of said three sub-partitions of said $n^{th}$ partition.

7. The modeling method of claim 5, wherein said total electric current equals a sum of electric currents passing through said N contacts and further equals a sum of electric currents passing through said 3N sub-partitions, $$I_{tot} = \sum_{n=1}^{N} I_{c,n} = \sum_{k=1}^{3N} i_k.$$

8. The modeling method of claim 1, said formula expressing said total parasitic resistance ($R_{tot}$) as a function of positions of (N−1) dividing lines and said iteratively adjusting minimizing said total parasitic resistance ($R_{tot}$) with respect to said positions of said (N−1) dividing lines.

9. The modeling method of claim 8, further comprising modeling performance of said semiconductor device based on said second value.

10. The modeling method of claim 8, said using of said partial derivatives in said formula to adjust said position of each dividing line being performed so as to account for said electric current flow following a path of least resistance.

11. The modeling method of claim 8, said arbitrarily establishing of said position of each dividing line comprising arbitrarily establishing widths of at least some sub-partitions of said partitions.

12. The modeling method of claim 8, said formula comprising:

$$R_{tot} = \sum_{k=1}^{3N} \left(\frac{i_k}{I_{tot}}\right)^2 r_{d,k} + \sum_{n=1}^{N} \left(\frac{I_{c,n}}{I_{tot}}\right)^2 R_{c,n} + \sum_{n} \left(\frac{I_{w,n}}{I_{tot}}\right) R_{w,n},$$

where said diffusion region is divided into N partitions equal to a same number N of contacts to said diffusion region, where each of said N partitions is further divided into three sub-partitions such that said diffusion region comprises 3N sub-partitions, where $r_{d,k}$ comprises a contribution of diffusion resistance of a $k^{th}$ sub-partition (k=1, 2, ..., 3N), where $i_k$ comprises a contribution of electric current of a $k^{th}$ sub-partition (k=1, 2, ..., 3N), where $R_{c,n}$ comprises a contribution of resistance of an $n^{th}$ contact (n=1, 2, ..., N), where $I_{c,n}$ comprises a contribution of electric current passing through said $n^{th}$ contact (n=1, 2, ..., N), where $R_{w,n}$ comprises a contribution of resistance of an $n^{th}$ segment of wire (n=1, 2, ..., last wire segment) that connects said $n^{th}$ contact to any one of an adjacent contact and said common node line, where $I_{w,n}$ comprises a contribution of electric current passing through said $n^{th}$ segment of wire (n=1, 2, ..., last wire segment), where $I_{tot}$ comprises total electric current through said diffusion region of a total width $W_{tot}$.

13. The modeling method of claim 12, wherein said total width ($W_{tot}$) of said diffusion region equals a sum of widths of said N partitions and further equals a sum of widths of said 3N sub-partitions, $$W_{tot} = \sum_{n=1}^{N} W_{c,n} = \sum_{k=1}^{3N} w_k,$$

where $w_k$ comprises a width of a $k^{th}$ sub-partition (k=1, 2, ..., 3N) and where $W_{c,n}$ comprises a width of an $n^{th}$ partition (n=1, 2, ..., N) and is equal to the following:

$W_{c,n}=w_{3n-2}+w_{3n-1}+w_{3n}$, with $w_{3n-2}$, $w_{3n-1}$ and $w_{3n}$ being equal to the respective widths of said three sub-partitions of said $n^{th}$ partition.

14. The modeling method of claim 12, wherein said total electric current equals a sum of electric currents passing through said N contacts, and further equals a sum of electric currents passing through said 3N sub-partitions, $$I_{tot} = \sum_{n=1}^{N} I_{c,n} = \sum_{k=1}^{3N} i_k.$$

15. The modeling method of claim 13, said sum of widths of said 3N sub-partitions being fixed such that there are (N−1) variables ($w_{3n}$, n=1, 2, ..., N−1) and said using of said partial derivatives comprising setting each of the following (N−1) partial derivatives to zero, $$\frac{\partial R_{tot}}{\partial w_{3n}} = 0, n = 1, 2, ..., N-1.$$

16. A modeling method comprising:
accessing, by a computer from a memory, a formula for determining total parasitic resistance ($R_{tot}$) associated with a diffusion region of a semiconductor device, said diffusion region being contacted by a number N of contacts, said contacts being connected by a wire to a common node line and said formula being based on a sum of resistance contributions from segments of said wire, from said N contacts, and from N partitions of said diffusion region and on electric current flow;
arbitrarily establishing, by said computer, a position of each dividing line separating adjacent partitions, said position being between adjacent contacts;
using, by a computer, said formula to determine a first value for said total parasitic resistance given said position of each dividing line; and
using, by said computer, partial derivatives of said total parasitic resistance ($R_{tot}$) with respect to variables in said formula to adjust said position of each dividing line in order to achieve a second value for said total parasitic resistance that is less than said first value.

17. A system comprising:
a memory storing a formula for determining total parasitic resistance ($R_{tot}$) associated with a diffusion region of a semiconductor device, said diffusion region being contacted by a number N of contacts, said contacts being connected by a wire to a common node line and said formula being based on a sum of resistance contributions from segments of said wire, from said N contacts, and from N partitions of said diffusion region and on electric current flow; and at least one processor performing the following:
arbitrarily establishing a position of each dividing line separating adjacent partitions, said position being between adjacent contacts;
using said formula to determine a first value for said total parasitic resistance given said position of each dividing line; and
iteratively adjusting said position of each dividing line in order to achieve a second value for said total parasitic resistance ($R_{tot}$) that is less than said first value.

18. The system of claim 17, said iteratively adjusting being performed so as to account for said electric current flow following a path of least resistance.

19. The system of claim 17, said arbitrarily establishing of said position of each dividing line comprising arbitrarily establishing widths of at least some sub-partitions of said partitions.

20. The system of claim 17, said formula comprising:

$$R_{tot} = \sum_{k=1}^{3N} \left(\frac{i_k}{I_{tot}}\right)^2 r_{d,k} + \sum_{n=1}^{N} \left(\frac{I_{c,n}}{I_{tot}}\right)^2 R_{c,n} + \sum_{n} \left(\frac{I_{w,n}}{I_{tot}}\right) R_{w,n},$$

where said diffusion region is divided into N partitions equal to a same number N of contacts to said diffusion region,
where each of said N partitions is further divided into three sub-partitions such that said diffusion region comprises 3N sub-partitions,
where $r_{d,k}$ comprises a contribution of diffusion resistance of a $k^{th}$ sub-partition (k=1, 2, . . . , 3N),
where $i_k$ comprises a contribution of electric current of a $k^{th}$ sub-partition (k=1, 2, . . . , 3N),
where $R_{c,n}$ comprises a contribution of resistance of an $n^{th}$ contact (n=1, 2, . . . , N),
where $I_{c,n}$ comprises a contribution of electric current passing through said $n^{th}$ contact (n=1, 2, . . . , N),
where $R_{w,n}$ comprises a contribution of resistance of an $n^{th}$ segment of wire (n=1, 2, . . . , last wire segment) that connects said $n^{th}$ contact to any one of an adjacent contact and said common node line,
where $I_{w,n}$ comprises a contribution of electric current passing through said $n^{th}$ segment of wire (n=1, 2, . . . , last wire segment),
where $I_{tot}$ comprises total electric current through said diffusion region of a total width $W_{tot}$.

21. The system of claim 20, wherein said total width ($W_{tot}$) of said diffusion region equals a sum of widths of said N partitions and further equals a sum of widths of said 3N sub-partitions, $$W_{tot} = \sum_{n=1}^{N} W_{c,n} = \sum_{k=1}^{3N} w_k,$$

where $w_k$ comprises a width of a $k^{th}$ sub-partition (k=1, 2, . . . , 3N) and where
$W_{c,n}$ comprises a width of an $n^{th}$ partition (n=1, 2, . . . N) and is equal to the following:
$W_{c,n} = w_{3n-2} + w_{3n-1} + w_{3n}$, with $w_{3n-2}$, $w_{3n-1}$ and $w_{3n}$ being equal to the respective widths of said three sub-partitions of said $n^{th}$ partition.

22. The system of claim 20, wherein said total electric current equals a sum of electric currents passing through said N contacts, and further equals a sum of electric currents passing through said 3N sub-partitions, $$I_{tot} = \sum_{n=1}^{N} I_{c,n} = \sum_{k=1}^{3N} i_k.$$

23. The system of claim 17, said formula expressing said total parasitic resistance ($R_{tot}$) as a function of positions of (N−1) dividing lines and said iteratively adjusting minimizing said total parasitic resistance ($R_{tot}$) with respect to said positions of said (N−1) dividing lines.

24. A non-transitory program storage device readable by a computer and tangibly embodying a program of instructions executable by said computer to perform a modeling method, said method comprising:
accessing a formula for determining total parasitic resistance ($R_{tot}$) associated with a diffusion region of a semiconductor device, said diffusion region being contacted by a number N of contacts, said contacts being connected by a wire to a common node line and said formula being based on a sum of resistance contributions from segments of said wire, from said N contacts, and from N partitions of said diffusion region and on electric current flow;
arbitrarily establishing a position of each dividing line separating adjacent partitions, said position being between adjacent contacts;
using said formula to determine a first value for said total parasitic resistance given said position of each dividing line; and
adjusting said position of each dividing line in order to achieve a second value for said total parasitic resistance that is less than said first value.

25. The program storage device of claim 24, said iteratively adjusting being performed so as to account for said electric current flow following a path of least resistance.

* * * * *